United States Patent [19]

Cosand

[11] Patent Number: 5,324,997
[45] Date of Patent: Jun. 28, 1994

[54] DELAYED NEGATIVE FEEDBACK CIRCUIT

[75] Inventor: Albert E. Cosand, Agoura Hills, Calif.

[73] Assignee: The United States of America as represented by the Secretary of the Air Force, Washington, D.C.

[21] Appl. No.: 21,385

[22] Filed: Feb. 23, 1993

[51] Int. Cl.⁵ .......................................... H03K 19/086
[52] U.S. Cl. ....................................... 307/455; 307/443
[58] Field of Search ............... 307/455, 443, 546, 547, 307/553

[56] References Cited

U.S. PATENT DOCUMENTS

| | | | |
|---|---|---|---|
| 4,400,632 | 8/1983 | Kushner | 307/299 A |
| 4,521,700 | 6/1985 | Blumberg et al. | 307/456 |
| 4,563,600 | 1/1986 | Kobayashi et al. | 307/455 |
| 4,609,837 | 9/1986 | Yagyuu et al. | 307/455 |
| 5,233,239 | 8/1993 | Sato | 307/455 |

*Primary Examiner*—Edward P. Westin
*Assistant Examiner*—Jon Santamauro
*Attorney, Agent, or Firm*—Donald J. Singer; William G. Auton

[57] ABSTRACT

A modification to the design of high speed logic circuitry will increase the speed of the circuitry. The modification consists of a delayed negative feedback added to the interface between two gates (a driving gate and a driven gate). The feedback is delayed by a time similar to the gate propagation delay, so that when a transition occurs, the feedback is effectively positive for times less than the feedback delay time. The effect of this is to add a bias at the interface that will aid the next transition of the driven gate during the transition. After a transition, the polarity of the bias is reversed so it will again aid the next transition.

3 Claims, 2 Drawing Sheets

DELAYED NEGATIVE FEEDBACK CIRCUIT

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to integrated circuits, and more specifically the invention pertains to a high speed logic device designed to increase the speed of the logic circuitry.

Modern information processing systems use high speed counters, programmable dividers, feedback shift registers (such as pseudo-noise code generators), and other circuits requiring high speed logic. Some of the types of systems requiring these functions include high performance frequency synthesizers, frequency-agile and/or low-probability-of-intercept radars, and spread-spectrum communications. All of these devices make use of semiconductor transistor circuits which have performance characteristics that are inherently limited by their switching lines.

The task of increasing the logic circuit speed for high speed logic devices is alleviated, to some extent, by the systems disclosed in the following U.S. Patents, the disclosures of which are incorporated herein by reference:

U.S. Pat. No. 4,400,632 issued to Kushner;
U.S. Pat. No. 4,521,700 issued to Blumberg; and
U.S. Pat. No. 4,609,837 issued to Yagyuu.

The patent of Kushner teaches the use of a differential transistor with feedback to increase circuit speed. The patent of Blumberg teaches a passive feedback circuit to increase logic speed. The patent of Yagyuu teaches a high speed logic circuit formed of a differential transistor circuit and a feedback circuit.

The present invention effectively increases the output voltage of the driving gate during a transition for a time of the order of the propagation delay of a gate; in the frequency domain, this is more or less equivalent to peaking the high frequency gain of the gate.

Previous circuit design techniques to peak the high frequency gain in monolithic integrated circuits have utilized the inductive component of a transistor emitter impedance as part of the collector load impedance, but this type of circuit requires higher power supply voltage (by one diode forward voltage) for an equivalent logic complexity, or alternatively, reduced the logic circuit complexity that can be achieved with a given power supply voltage. This use of emitter inductance for peaking does not allow as much latitude in choice of the peaking characteristic, and is more noisy than the new circuit described here. The use of actual inductors in the form of a flat spiral of conductor on the integrated circuit has been used in some GaAs linear integrated circuits, but is not generally considered practical in logic circuits.

While the prior art methods are instructive, the need to enhance the performance characteristics of high speed circuits is an ongoing technical concern. The present invention is intended to help satisfy that need.

SUMMARY OF THE INVENTION

The present invention includes a high speed logic device designed to increase the speed of the logic circuitry. The device consists of a delayed negative feedback circuit added to the interface between two gates (i.e. a driving gate and a driven gate). The feedback is delayed by a time similar to the gate propagation delay so that when a transition occurs, the feedback is effectively positive for times less than the feedback delay time. The effect of this is to add a bias at the interface that will aid the next transition of the driven gate during the transition. After a transition, the polarity of the bias is reversed so it will again aid the next transition. The logic device uses differentially driven transistor pairs as current switches to perform series gated logic. The voltage swing across the load resistors is typically 200 mV. The switching transistors are kept from saturation in order to achieve fast switching although a small collector-base forward bias (equal to the voltage across the collector load resistor) is allowed at the transistor terminals. Outputs are taken either directly from the load resistor or from emitter followers. The emitter follower outputs are level shifted by the base-emitter voltage (VBE) of the emitter followers. The inputs in the differential transistors are driven by signals with a nominal high level equal to the positive supply voltage.

The purpose of the invention is to obtain an increase in the maximum speed of logic circuitry. The technique works particularly well with integrated circuits that use differential current-mode logic, which is the fastest type of logic circuitry presently in use in silicon monolithic integrated circuits, so that it provides a true advance in the speed available with any given integrated circuit fabrication technology. In some cases the increased speed will allow silicon integrated circuits to be used in place of GaAs, and thus avoid the higher cost and increased low frequency noise generally associated with GaAs.

It is an object of the present invention to increase the speed of logic circuitry.

It is another object of the present invention to provide a delayed negative feedback circuit to aid the transition of successive switches between the gates of transistor pairs in logic circuits.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes the use of a delayed negative feedback circuit added to the interface between two gates (i.e. a driving gate and a driven gate). The feedback is delayed by a time similar to the gate propagation delay so that when a transition occurs, the feedback is effectively positive for times less than the feedback delay time. The effect of this is to add a bias at the interface that will aid the next transition of the driven gate during the transition. After a transition, the polarity of the bias is reversed so it will again aid the next transition.

Figure 1:
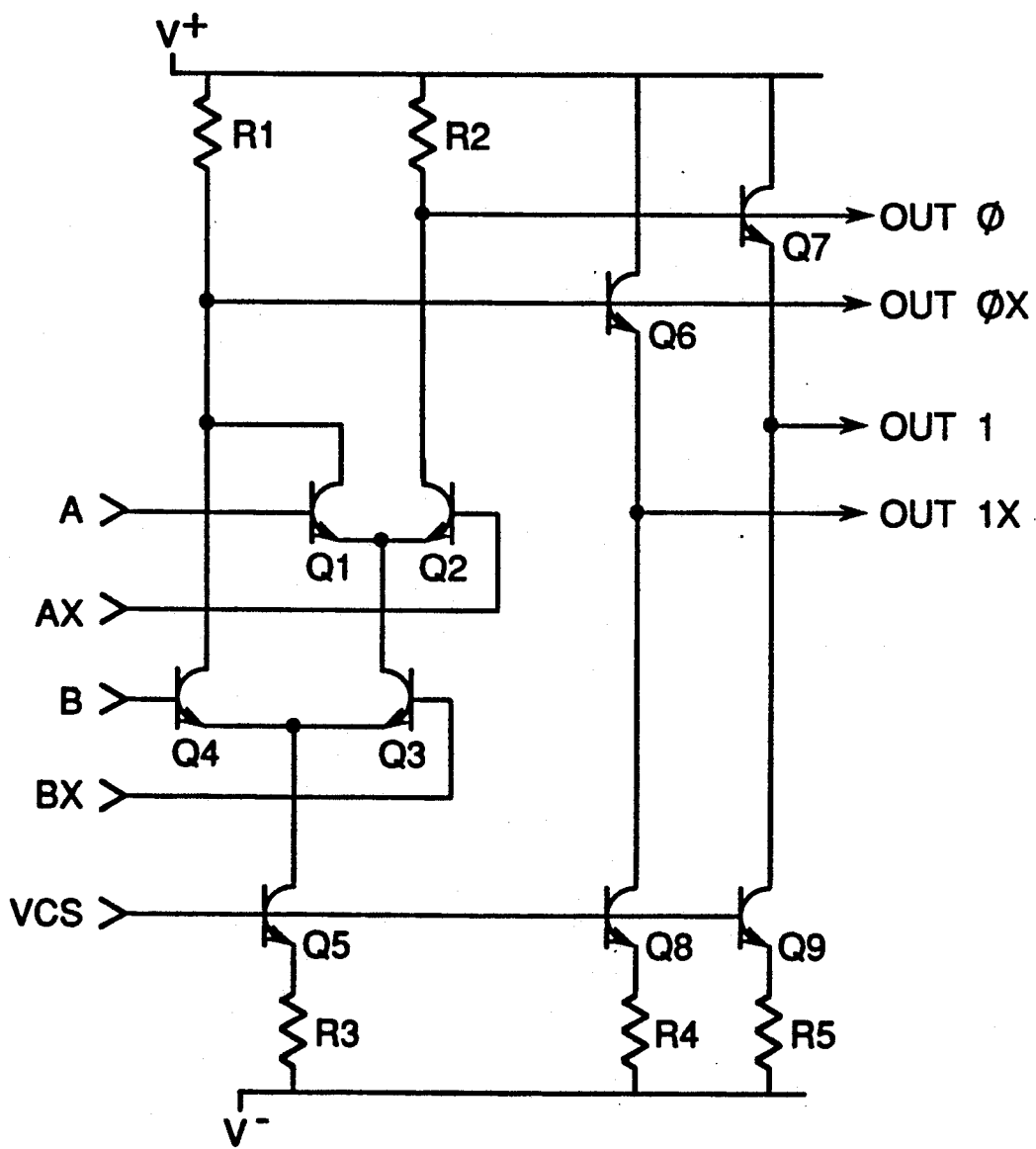
FIG. 1 is an electrical schematic of a prior art OR gate circuit.

In order to understand the application of the present invention, the reader's attention is directed towards FIG. 1, which is an electrical schematic of a prior art differential current mode logic (DCML) OR gate. The present invention works best with DCML, although it could be applied to other types of logic circuits such as TTL, ECL, or some forms of CMOS or GaAs FET logic.

Figure 2:
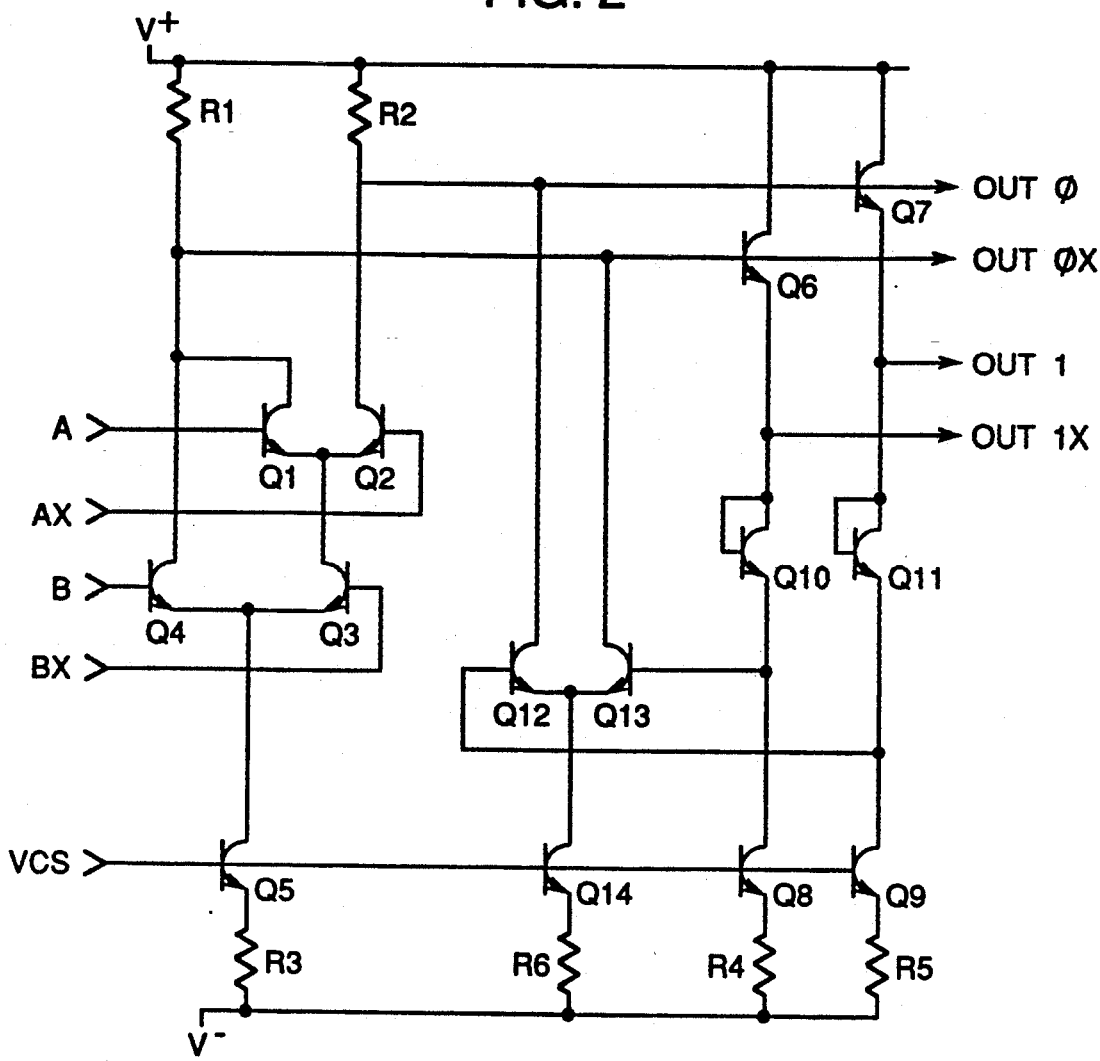
FIG. 2 is an electrical schematic of an embodiment of the present invention.

The OR gate of FIG. 1 makes use of nine transistors Q1–Q9 and five resistors R1–R5. FIG. 2 is the same gate (as depicted in FIG. 1) with the added negative feedback circuitry of the present invention. The principles of this invention are described below.

In both FIGS. 1 and 2, the logic circuit uses differentially driven transistor pairs as current switches to perform series-gated logic. The voltage swing across the load resistors is typically about 200 mV. The switching transistors Q1–Q4 are kept out of saturation so that fast switching is obtained, although a small collector-base forward bias (equal to the voltage across the collector load resistor) is allowed at the transistor terminals. Outputs are taken either directly from the load resistors (OUT0, OUT0X) or from the emitter followers (OUT1, OUT1X); the latter outputs are level shifted by the base-emitter voltage (VBE) of the emitter followers. The inputs A0 and A0X are driven by signals with a nominal high level equal to the positive supply voltage, as are obtained from the outputs OUT0 and OUT0X, while the B1 and B1X inputs are driven by signals level shifted one VBE below the positive supply voltage so that transistor Q3 stays out of saturation.

The two principal limitations on the switching speed of this type of gate are the time required to drive sufficient charge into the base terminals of a differential pair to switch its collector current from one transistor to the other, and the time for the differential collector voltage to change sign after the current has been switched. Some of the factors that determine the first part of the switching time include the external voltage applied across the base terminals, and the device properties inherent to the fabrication process such as base resistance, base transit time, and junction capacitances. The time constant for the collector voltage is mostly determined by the product of the load resistance and the net capacitance on the collector nodes. The low collector voltage swing used with this logic allows a shorter collector time constant at a given gate current than can be obtained for other decreasing the value of the collector load resistors and using a smaller voltage swing, but the time required to drive the required switching charge through the base resistance of the next gate increases as the voltage swing decreases. The collector voltage swing that minimizes the delay of a series of gates is typically around 200 mV, but varies somewhat depending on factor such as the parasitic resistances and capacitances obtained with a particular fabrication process, and the logic fanout.

Figure 3:
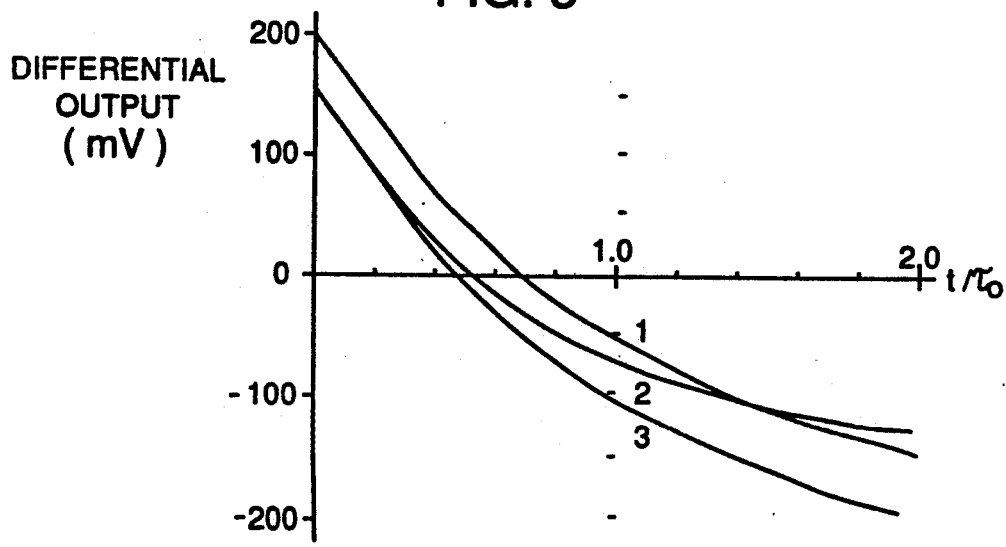
FIG. 3 is a chart of collector voltage vs. time for an RC model with time constant $\tau_o$, a shortened time constant, and an offset swing with the nominal time constant.

Added circuitry shown in FIG. 2 provides a way around this limitation. When the gate has settled to a steady state the current through Q14, which is switched by the pair Q12 and Q13 produces a differential voltage in the load resistors R1 and R2 that opposes the voltage difference due to the main gate current. If this additional voltage were to remain constant during the next switching transition, it would effectively offset the differential output voltage of the gate in the direction that it is switching. For more specific example, consider the case that the load resistors are 100 ohms each, the principal gate current through Q5 and 2 mA, and the secondary gate current through Q14 is 0.5 mA. The steady state differential output is then 150 mV. When the gate is switched, the output voltage slews toward zero at a slew rate characteristic of a 400 mV peak to peak differential swing, but the starting voltage is only 150 mV away from the logic threshold of zero volts differential. The time to reach the threshold due to the collector slewing limitation is thus significantly reduced; the offset case is faster even than the case where the collector load resistor value has been reduced to give a 150 mV swing, and thus a collector time constant only 0.75 as large. As was previously mentioned, the total switching time of a gate includes both the time to drive enough charge into the base to switch the collector current, as well as the time for the collector voltage to change. The first part of the switching time will depend on the voltage applied across the bases of the differential pair, so a threshold, but the time to slew enough past threshold to have sufficient overdrive to rapidly switch the next gate. The exact amount of overdrive required is not easily specified, but a value in the range of 50 mV to 100 mV is probably appropriate. FIG. 3 compares the voltage vs time obtained from a simple RC circuit with a 200 mV differential (400 mV peak to peak) swing, a 200 mV differential swing offset by 50 mV, and a 150 mV differential swing with a time constant shortened need to 0.75 of that of the first two cases. The offset 200 mV case is the first to cross threshold by a small margin, but is faster than either of the other cases by at least 25% at the 100 mV level. The actual switching waveform of the gate is obviously more complicated than this simple RC model, as it must involve a convolution of the current switching vs. time with the collector voltage response, but this simple model shows the basis for the speed improvement obtained with this technique.

After the switching has taken place to the extent that there is sufficient overdrive to switch another gate being driven by the gate under consideration, there will also be a sufficient overdrive to switch the differential pair Q12 and Q13, which then reverses the sign of the secondary voltage added into the gate output so that it will oppose the now present state of the gate, and offset the output voltage in the direction that it will switch in the next transition of the gate. The speed with which Q12 and Q13 respond to the gate output influences the shape of the output waveform; as the switching takes place, the output ceases following a curve that would ultimately settle out to a 250 mV differential and beings to settle toward a 150 mV differential. If there is sufficient delay in the switching of Q12 and Q13, the output vs. time will display a peak as it overshoots past 150 mV before settling to its final value. For the particular case that was modelled, fastest switching seems to occur when the delay in the feedback is close to, but slightly less than, that required to produce overshoot. The time required for Q12 and Q13 to switch is influenced by the layout geometry chosen for the switch transistors Q12 and Q13, and also for the level shift transistors Q10 and Q11. The delay can be increased by using a layout with single base contacts and/or a wider emitter stripe to increase the base resistance.

The circuitry shown in FIG. 2 constitutes one logic gate. it is a differential current mode logic gate, with differentially driven inputs A and B, and differential outputs. It is intended to be used with a fully differential (two wires per signal) interconnect. The signal "A" is considered true (or high) if input A is more positive than input AX, and false (or low) if input A is more negative than input AX. it may be noted that the signals driving the "B" input should be level shifted more negative than the "A" signals by one base-emitter voltage drop so that transistor Q3 is not driven into saturation. The output of the gate may be taken from out0 and outox to drive an upper level input such as "A," or from out1 and out1x, which are level shifted so as to be suitable for driving a lower level input such as "B."

The transistors Q10 and Q11 serve to further level shift the output of the gate so that transistors Q12 and Q13 provide the negative feedback within the gate. Transistor Q14, along with its emitter resistor, acts as a source of constant to provide the operating bias for Q12 and Q13; similarly, Q5 provides a constant bias current to Q3 and Q4, and Q8 and Q9 provide constant bias currents to the level shift transistors Q6, Q7, Q10, and Q11.

The logic circuitry described herein uses a fully differential interconnect, with two wires per signal. Logic inversion (the NOT function) is obtained with zero delay by interchanging the signal and complement wires at a connection to an input on an output port of the gate. For example, if the pin labelled out1x is used as the "signal" and the pin labelled out1 as the "complement," then the NOR function is obtained from the circuits of FIG. 1 or FIG. 2. If all three signals to the OR gate shown are inverted, its function is then NOT (NOTA or NOTB)=A and B.

"VCS" in FIGS. 1 and 2 is a nominally fixed (although temperature dependent) voltage. At biases the combination of a transistor and the resistor from the transistor emitter to the negative supply voltage so that the collector current of the transistor is constant, or nearly constant. The collector current is then the bias current for the current steering (or "current mode") logic circuitry above it. This is typical of the biasing used in normal ECL logic circuits. The circuitry (not shown) that generates VCS may be designed so that VCS varies with temperature and/or power supply voltage to give some specified variation in the gate bias current.

FIG. 3 is a chart which depicts the collector voltage vs. time for an RC model with a nominal time constant $\tau_o$, a shortened time constant $0.75 \times \tau_o$, and an offset swing with the nominal time constant. In FIG. 3:

Curve 1: Time Constant=$\tau_o$, 400 mVpp swing.
Curve 2: Time Constant=$0.75\tau_o$, 300 mVpp swing.
Curve 3: Time Constant=400 mVpp swing offset $-50$ mV.

It is worth noting that, in the example cited in FIG. 3, the offset gate operates at a higher total current than the other two gates, since the primary gate current is the same for all three cases, but the offset gate also has the secondary current source, so that it dissipates more power than the gates to which it was compared. However, the current that is switched by the input transistors is the same for all the gates, so the current required to drive the speed merely by decreasing the load resistor value and increasing the gate current to maintain the logic voltage, the charge required at the input to switch the input also increases, and after a certain point, no further increase in gate speed is available in this manner.

As mentioned above, the application of the delayed negative feedback circuit to the OR gate in FIG. 2 is only one example of the use of the present invention. The switching speed of all logic circuits may be improved by similar implementations. These logic circuits include the: AND, OR, NOT, NAND and NOR circuits when they are implemented by switching transistor pairs.

While the invention has been described in its presently preferred embodiment it is understood that the words which have been used are description rather than words of limitation and that changes within the purview of the appended claims may be made without departing from the scope and spirit of the invention in its broader aspects.

What is claimed is:

1. A delayed negative feedback logic circuit, which receives a first and second input logic signal, and which produces a logic output signal that represents a logic function performed upon the first and second logic signal said delayed negative feedback logic circuit comprising:

a set of driving transistors that output operating bias current input signals;

a first transistor which has a base terminal, a collector terminal and an emitter terminal, said base terminal receiving said first input logic signal, said collector terminal outputting a first transistor signal;

a second transistor which has a base terminal, an emitter terminal and a collector terminal, said base terminal of the second transistor receiving a first input comparison signal representing an inverted value of the first input logic signal, said emitter terminal of the second transistor being connected to the emitter terminal of the first transistor to form a first node, and said collector terminal of the second transistor outputting a second transistor signal;

a third transistor which has a base terminal, an emitter terminal and a collector terminal, said base terminal of said third transistor receiving a second input comparison signal representing an inverted value of the second input logic signal, said collector terminal of the third transistor being connected to the first node;

a fourth transistor which has a base terminal, an emitter terminal and a collector terminal, said base terminal of said fourth transistor receiving the second input logic signal, said emitter of said fourth transistor being connected to the emitter of the third transistor to form a second node, said collector terminal of said fourth transistor outputting a fourth transistor signal;

a fifth transistor which has a base terminal, a collector terminal and an emitter terminal, said collector terminal of said fifth transistor receiving a driving voltage source, said base terminal of said fifth transistor being connected to a first output terminal and to the collector terminal of said second transistor to receive the second transistor output signal therefrom, said emitter terminal of said fifth transistor being connected to a second output terminal to output a logic "1" signal when said fifth transistor is turned on;

a sixth transistor which has a base terminal, a collector terminal and an emitter terminal said base terminal of the sixth transistor being connected to the collector terminal of the first transistor to receive the first transistor output signal therefrom, said collector terminal being connected to the driving voltage source to receive the driving voltage signal therefrom, said emitter terminal of the sixth transistor outputting a comparison signal representing an inverted value of the signal at the emitter of the fifth transistor; and a means for reversing the logic of the operating bias current input signals, said reversing means being electrically connected with the base terminals of the fifth and sixth transistors to reduce their switching rate by receiving the output of the emitter terminals of the fifth and sixth transistors and reversing the logic signal on the inputs at the base terminals of the fifth and sixth transistors.

2. A delayed negative feedback logic circuit, as defined in claim 1, wherein said set of driving transistors comprises:

a seventh transistor which has a base terminal, an emitter terminal and a collector terminal, said base terminal of said seventh transistor being connected to a voltage control source to receive a voltage control signal therefrom, said emitter terminal of said seventh transistor being connected to a negative voltage source to receive a negative voltage signal therefrom, said collector terminal of said seventh transistor being connected to the second node between the emitter terminals of the third and fourth transistors to supply a first operating base current input signal thereto;

an eighth transistor which has a base terminal, an emitter terminal, and a collector terminal, said emitter terminal of said eighth transistor being connected to said negative voltage source to receive said negative voltage signal therefrom, said base terminal of said eighth transistor being connected to said voltage control source to receive said voltage control signal therefrom, and said eighth transistor having its collector terminal connected with the emitter terminal of the sixth transistor to supply a second bias operating current thereto; and a ninth transistor which has a base terminal, an emitter terminal and a collector terminal, wherein said emitter terminal of said ninth transistor is connected to said negative voltage source to receive said negative voltage signal therefrom, and said base terminal of said ninth transistor is connected with said voltage control source to receive said voltage control signal therefrom, and wherein said collector terminal of said ninth transistor is connected to the emitter terminal of the fifth transistor to supply a third base operating current thereto.

3. A delayed negative feedback logic circuit, as defined in claim 2, wherein said set of driving transistors includes a tenth transistor which has a base terminal connected with the voltage control source to receive the voltage control signal therefrom, and an emitter terminal connected to the negative voltage source to receive the negative voltage signal therefrom, and wherein said tenth transistor outputs a fourth bias operating signal out its collector terminal, and wherein said reversing means comprises;

an eleventh transistor which has a base terminal connected with the collector terminal of the ninth transistor to receive the third bias operating signal therefrom, said eleventh transistor having an emitter terminal connected with the collector terminal of the tenth transistor to receive the fourth bias operating signal therefrom, and wherein said eleventh transistor has a collector terminal which outputs a reversed signal to the base terminal of the fifth transistor; and a twelfth transistor which has a base terminal connected with the collector terminal of the eighth transistor to receive the second bias operating signal therefrom, said twelfth transistor having an emitter terminal connected with the collector terminal of the tenth transistor to receive the fourth bias operating of the tenth transistor to receive the fourth bias operating signal therefrom, and wherein said twelfth transistor has a collector terminal which outputs a reversed signal to the base terminal of the sixth transistor.

* * * * *